(12) United States Patent
Kim et al.

(10) Patent No.: US 8,247,834 B2
(45) Date of Patent: Aug. 21, 2012

(54) LIGHT-EMITTING DIODE CHIP FOR BACKLIGHT UNIT, MANUFACTURING METHOD THEREOF, AND LIQUID CRYSTAL DISPLAY DEVICE INCLUDING THE SAME

(75) Inventors: Cheol Se Kim, Daegu (KR); Hoe Sup Soh, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 303 days.

(21) Appl. No.: 11/802,409

(22) Filed: May 22, 2007

(65) Prior Publication Data
US 2007/0272933 A1  Nov. 29, 2007

(30) Foreign Application Priority Data
May 23, 2006 (KR) .................. 10-2006-0046213

(51) Int. Cl.
*H01L 33/48* (2010.01)
(52) U.S. Cl. ................... 257/99; 257/E33.062
(58) Field of Classification Search .......... 257/98–100, 257/E33.062–E33.065
See application file for complete search history.

(56) References Cited

U.S. PATENT DOCUMENTS

| | | | | |
|---|---|---|---|---|
| 5,977,565 A | * | 11/1999 | Ishikawa et al. | 257/81 |
| 6,642,548 B1 | * | 11/2003 | Brown et al. | 257/99 |
| 6,784,462 B2 | * | 8/2004 | Schubert | 257/98 |
| 6,849,881 B1 | * | 2/2005 | Harle et al. | 257/191 |
| 6,881,985 B2 | * | 4/2005 | Murakami et al. | 257/99 |
| 7,502,401 B2 | * | 3/2009 | Miller et al. | 372/50.124 |
| 2005/0152417 A1 | * | 7/2005 | Lin | 372/43 |
| 2005/0259195 A1 | * | 11/2005 | Koganezawa | 349/65 |
| 2005/0273327 A1 | * | 12/2005 | Krishnan | 704/235 |
| 2005/0274972 A1 | * | 12/2005 | Roth et al. | 257/100 |
| 2006/0017878 A1 | * | 1/2006 | Hsuan | 349/192 |
| 2006/0040435 A1 | * | 2/2006 | Morisue et al. | 438/151 |
| 2006/0049419 A1 | * | 3/2006 | Tanaka et al. | 257/98 |
| 2006/0091417 A1 | * | 5/2006 | Sugimoto et al. | 257/99 |
| 2006/0097283 A1 | * | 5/2006 | Taki | 257/200 |
| 2006/0231852 A1 | * | 10/2006 | Kususe et al. | 257/99 |
| 2006/0273327 A1 | * | 12/2006 | Im | 257/79 |
| 2007/0176193 A1 | * | 8/2007 | Nagai | 257/98 |
| 2007/0181895 A1 | * | 8/2007 | Nagai | 257/98 |
| 2008/0135868 A1 | * | 6/2008 | Okagawa et al. | 257/99 |

FOREIGN PATENT DOCUMENTS

| | | | |
|---|---|---|---|
| JP | 09055532 A | * | 2/1997 |
| JP | 2005284051 | * | 10/2005 |
| WO | WO 2005/022656 | | 3/2005 |

* cited by examiner

*Primary Examiner* — Kiesha Bryant
*Assistant Examiner* — Ali Naraghi
(74) *Attorney, Agent, or Firm* — McKenna Long & Aldridge LLP

(57) ABSTRACT

A light-emitting diode includes a substrate, a buffer layer on the substrate, a first semiconductor layer on the buffer layer, a light-emitting layer on the first semiconductor layer, a second semiconductor layer on the light-emitting layer, wherein the first semiconductor layer is partially exposed through the second semiconductor layer and the light-emitting layer, a first electrode on the exposed first semiconductor layer, and a second electrode on the second semiconductor layer, the second electrode having a grid shape.

3 Claims, 4 Drawing Sheets ature, and a portion of the n-type semiconductor layer 25.
LIGHT-EMITTING DIODE CHIP FOR BACKLIGHT UNIT, MANUFACTURING METHOD THEREOF, AND LIQUID CRYSTAL DISPLAY DEVICE INCLUDING THE SAME This application claims the benefit of Korean Patent Application No. 10-2006-0046213, filed May 23, 2006, which is hereby incorporated by reference for all purposes as if fully set forth herein.

BACKGROUND OF THE INVENTION

1. Field of the Invention

The present invention relates to a light-emitting diode (LED), and more particularly, to a light-emitting diode (LED) chip for a backlight unit, a manufacturing method thereof, and a liquid crystal display (LCD) device including the same.

2. Discussion of the Related Art

Light-emitting diodes (LEDs) have been widely used as a light source because of small size, low power consumption, and high reliability.

LEDs are formed of III-V semiconductor compounds. In general, LEDs emitting red, green or yellow light are formed of III-V semiconductor compounds, which include arsenide (As) or phosphide (P) as an element of group V, such as aluminum gallium arsenide (AlGaAs), gallium aluminum phosphide (GaAlP), gallium phosphide (GaP) or indium gallium aluminum phosphide (InGaAlP). LEDs emitting green or blue light are formed of III-V semiconductor compounds such as gallium nitride (GaN).

FIG. 1 is a schematic view illustrating an LED chip according to the related art.

In FIG. 1, an LED chip 37 includes a substrate 21, a buffer layer 23, an n-type semiconductor layer 25, a light-emitting layer 27, and a p-type semiconductor layer 29. The LED chip 37 further includes an n-type electrode 35, a p-type electrode 33, and a transparent electrode 31. The n-type electrode 35 is formed on the n-type semiconductor layer 25 partially removing the p-type semiconductor layer 29, the light-emitting layer 27 and a portion of the n-type semiconductor layer 25. The transparent electrode 31 is disposed on the p-type semiconductor layer 29, and the p-type electrode 33 is formed on the transparent electrode 31. The n-type electrode 35 and the p-type electrode 33 provide carriers to the n-type semiconductor layer 25 and the p-type semiconductor layer 29, respectively.

When a forward bias is applied to the n-type electrode 35 and the p-type electrode 33, electrons and holes are transmitted into the light-emitting layer 27 via the n-type semiconductor layer 25 and the p-type semiconductor layer 29, and the electrons recombine with the holes, thereby emitting light.

LED lamps including such an LED chip have been widely used for outdoor advertising bulletin boards or as a backlight source for liquid crystal display (LCD) devices, which are not self-luminous and require an additional light source.

The light emitted from the LED chip 37 is a natural light including light having various polarizations that have different vibration planes for its electric fields.

When such an LED chip is used for devices that use a polarized light with a polarizer such as LCD devices, only about 50% of the light emitted from the LED chip 37 passes through the polarizer. Moreover, the light passing through the polarizer is partially absorbed or reflected while passing through other layers, such as a liquid crystal layer or insulating layers. Accordingly, there is a loss of light, and the brightness of the devices is reduced. Also, increasing the brightness of the devices results in a high power consumption.

SUMMARY OF THE INVENTION

Accordingly, the present invention is directed to a light-emitting diode chip for a backlight unit, a manufacturing method thereof, and a liquid crystal display device including the same that substantially obviate one or more problems due to limitations and disadvantages of the related art.

An advantage of the present invention is to provide a liquid crystal display (LCD) device having an LED backlight unit with a high brightness and method for fabricating the same.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, a light-emitting diode includes a substrate, a buffer layer on the substrate, a first semiconductor layer on the buffer layer, a light-emitting layer on the first semiconductor layer, a second semiconductor layer on the light-emitting layer, wherein the first semiconductor layer is partially exposed through the second semiconductor layer and the light-emitting layer, a first electrode on the exposed first semiconductor layer, and a second electrode on the second semiconductor layer, the second electrode having a grid shape.

In another aspect of the present invention, a manufacturing method of a light-emitting diode includes forming a buffer layer on a substrate, forming a first semiconductor layer on the buffer layer, forming a light-emitting layer on the first semiconductor layer, forming a second semiconductor layer on the light-emitting layer, selectively removing the second semiconductor layer and the light-emitting layer to thereby partially expose the first semiconductor layer, forming a first electrode on the exposed first semiconductor layer, and forming a second electrode on the second semiconductor layer, the second electrode having a grid shape.

In yet another aspect of the present invention, a liquid crystal display device includes a backlight unit including light-emitting diode lamps and optical sheets on the light-emitting diode lamps, wherein each of the light-emitting diode lamps has a light emitting diode including: a substrate; a buffer layer on the substrate; a first semiconductor layer on the buffer layer; a light-emitting layer on the first semiconductor layer; a second semiconductor layer on the light-emitting layer, wherein the first semiconductor layer is partially exposed through the second semiconductor layer and the light-emitting layer; a first electrode on the exposed first semiconductor layer; and a second electrode on the second semiconductor layer, the second electrode having a grid shape; and a liquid crystal panel over the backlight unit, the liquid crystal panel including first and second substrates and a liquid crystal layer between the first and second substrates.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings.

Figure 1:
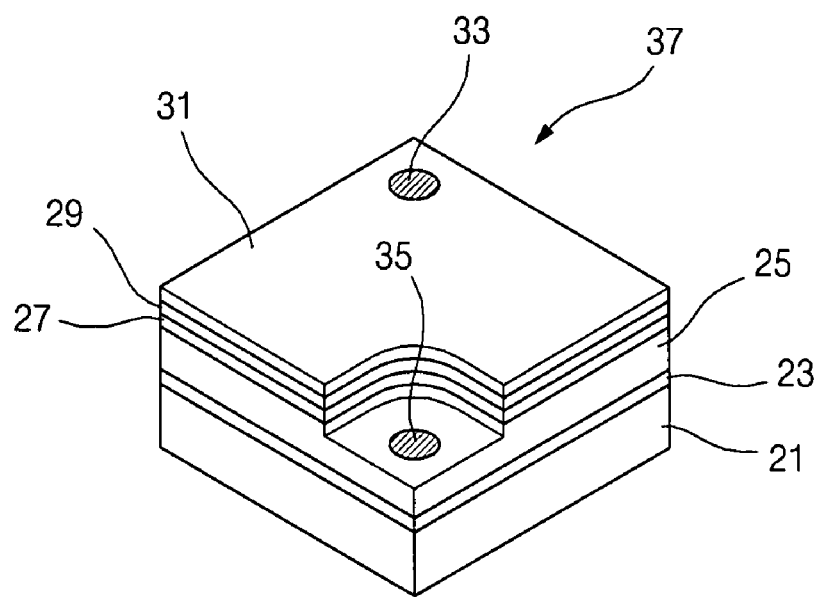
FIG. 1 is a schematic view illustrating an LED chip according to the related art.
Figure 2A:
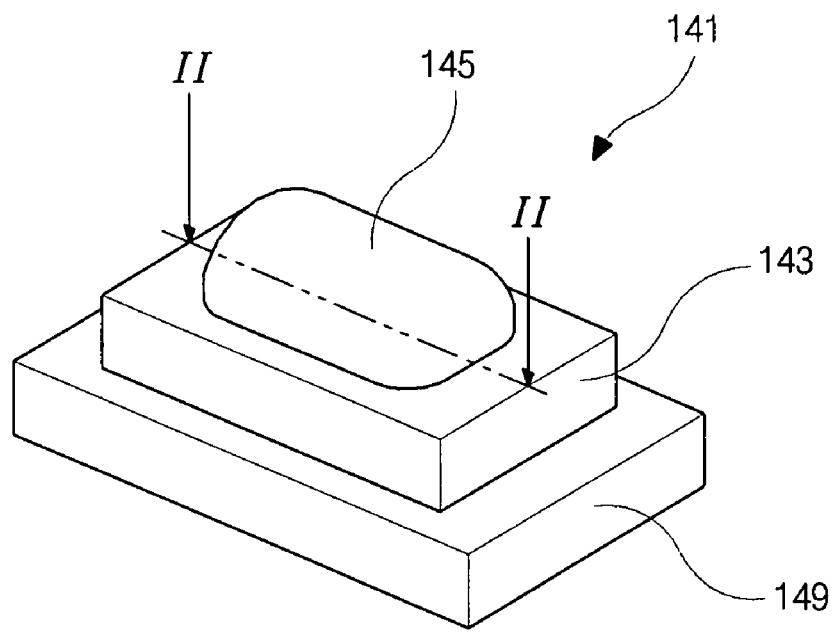
FIG. 2A is a schematic view illustrating an LED lamp according to the present invention.
Figure 2B:
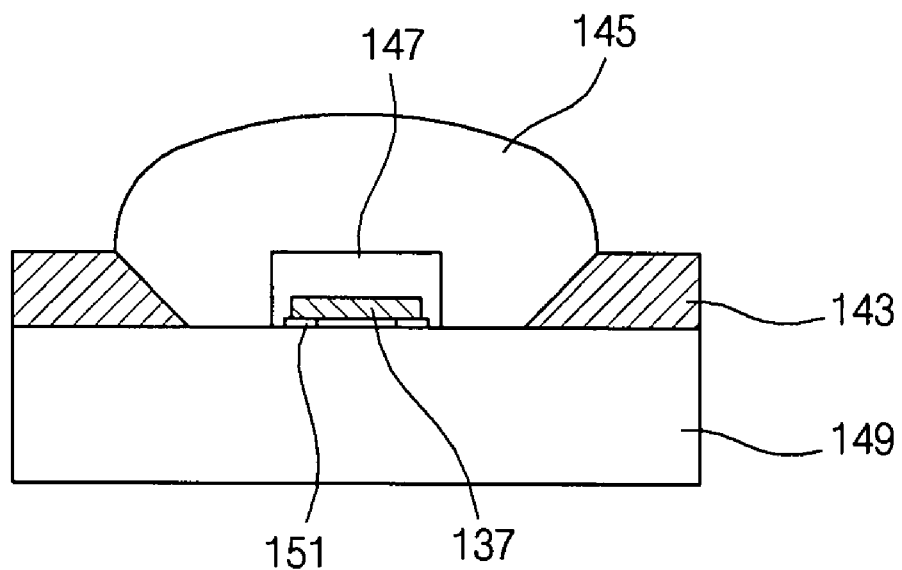
FIG. 2B is a cross-sectional view along the line II-II of FIG. 2A.

FIG. 2A is a schematic view illustrating a light-emitting diode (LED) lamp according to the present invention, and FIG. 2B is a cross-sectional view along line II-II in FIG. 2A.

In FIGS. 2A and 2B, the LED lamp 141 includes a reflecting frame 143 disposed on a printed circuit board 149 and having an opening. A controlling unit (not shown) is formed on the printed circuit board 149. An LED chip 137 is disposed within the opening, and a wiring portion 151 is interposed between the LED chip 137 and the printed circuit board 149. A phosphorescent material 147 covers the LED chip 137. A lens 145 is formed over the phosphorescent material 147 and the LED chip 137, and covers the opening of the reflecting frame 143. The LED chip 137 emits polarized light, and the lens 145 uniformly diffuses the light from the LED chip 137.

The reflecting frame 143 is formed of a material that reflects light well. The reflecting frame 143 dissipates the heat generated when light is emitted. The printed circuit board 149 may be a metal core printed circuit board that may dissipate heat. The LED lamp 141 may include a transparent resin colored with one of red, green and blue.

When a voltage is applied to the LED chip 137, light is emitted from the LED chip 137. The light is incident on the phosphorescent material 147 and is diffused by the lens 145. The LED chip 137 of the LED lamp 141 according to the present invention emits light polarized in a predetermined direction.

Figure 3:
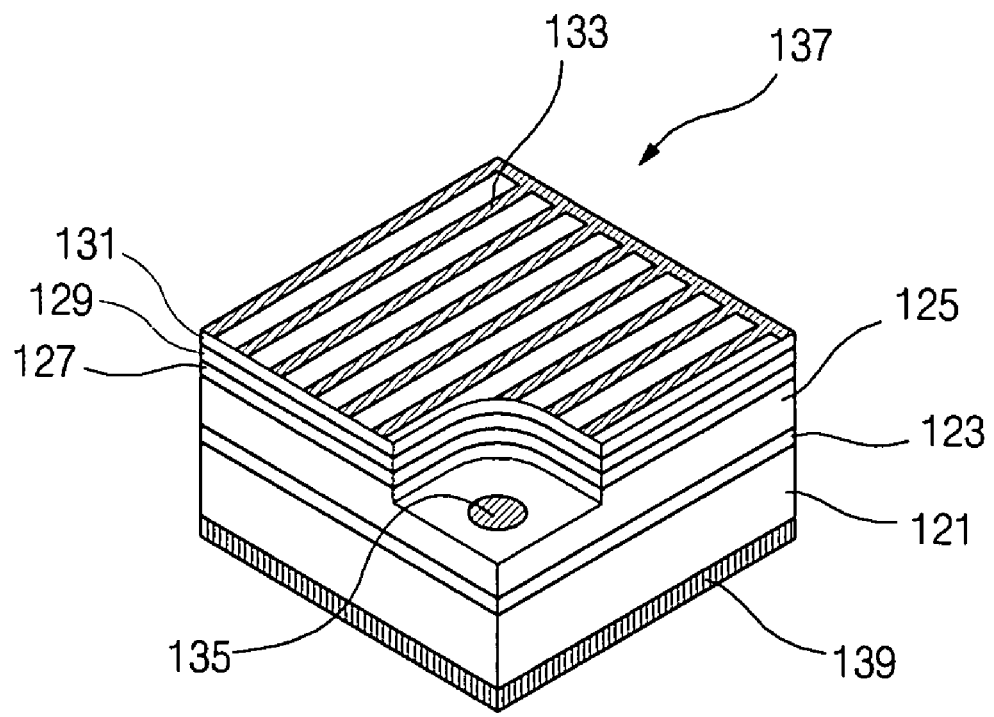
FIG. 3 is a schematic view illustrating an LED chip according to an exemplary embodiment of the present invention.

FIG. 3 is a schematic view illustrating an LED chip according to an exemplary embodiment of the present invention. The LED chip may have a substantially square shape.

In FIG. 3, the LED chip 137 includes a buffer layer 123, a first semiconductor layer 125, a light-emitting layer 127, a second semiconductor layer 129, and a transparent electrode 131 sequentially disposed on a first surface of a substrate 121. The LED chip 137 further includes a first electrode 135 and a second electrode 133. A reflecting layer 139 is formed on a second surface of the substrate 121.

The first electrode 135 is formed on the first semiconductor layer 125 after partially removing the second semiconductor layer 129 and the light-emitting layer 127. The first semiconductor layer 125 may be also partially removed for the first electrode 135. The second electrode 133 is formed on the transparent electrode 131. The second electrode 133 has a grid shape including wires (e.g., a pattern with multiple rows), as illustrated in FIG. 3. As a result, the light emitted from the LED chip 137 is polarized due to the grid-shaped second electrode 133.

A method of fabricating an LED chip according to the present invention will be hereinafter described. The LED chip 137 may be a gallium nitride (GaN)-based LED.

The buffer layer 123 is formed on the substrate 121. The substrate 121 may be formed of an insulating material, such as sapphire or silicon carbide (SiC). The buffer layer 123 minimizes dislocation and controls propagation of defects. The buffer layer 123 may be formed by a low temperature growth method. The buffer layer 123 may include one of gallium nitride (GaN), aluminum nitride (AlN), aluminum gallium nitride (AlGaN) and indium gallium nitride (InGaN). For example, the buffer layer 123 may be formed of gallium nitride (GaN) by using one of a metal organic chemical vapor deposition (MOCVD) method, a molecular beam epitaxy (MBE) method and a vapor phase epitaxy (VPE) method.

The first semiconductor layer 125 is formed on the buffer layer 123. The first semiconductor layer 125 may be an n-type and may be formed of silicon-doped gallium nitride (GaN: Si).

The light-emitting layer 127 is formed on the first semiconductor layer 125. The light-emitting layer 127 may be formed of one of indium gallium nitride/aluminum gallium nitride (InGaN/AlGaN), indium gallium nitride/gallium nitride (InGaN/GaN) and gallium nitride/aluminum gallium nitride (GaN/AlGaN). The light-emitting layer 127 of InGaN/AlGaN or GaN/AlGaN emits ultraviolet (UV) light, wherein a magnesium-doped aluminum gallium nitride (AlGaN:Mg) layer may be further formed on the light-emitting layer 127 to improve light efficiency. The light-emitting layer 127 of InGaN/GaN emits a blue light.

The second semiconductor layer 129 may be a p-type. The second semiconductor layer 129 may be formed of magnesium-doped gallium nitride (GaN:Mg).

To efficiently inject carriers, the transparent electrode 131 may be formed on the second semiconductor layer 129. The transparent electrode 131 uniformly and efficiently diffuses carriers along a horizontal direction of the second semiconductor layer 129. The transparent electrode 131 may be formed of an ultra thin metallic layer. For example, the transparent electrode 131 may be formed of nickel and gold (Ni/Au).

The transparent electrode 131, the second semiconductor layer 129, the light-emitting layer 127 and the first semiconductor layer 125 are partially removed by a dry-etching method to thereby expose the first semiconductor 125.

The first electrode 135 is formed on the exposed first semiconductor layer 125. The first electrode 135 may be formed of a metallic material that forms an ohmic contact with the first semiconductor layer 125. For example, the first electrode 135 may be formed of titanium and aluminum (Ti/Al).

The grid-shaped second electrode 133 is formed on the transparent electrode 131 by depositing a metallic material and then selectively etching the metallic material by a patterning method, such as photolithography. The second electrode 133 may be formed of a metallic material that forms an ohmic contact with the second semiconductor layer 129. For example, the second electrode 133 may be formed of nickel and gold (Ni/Au).

The reflecting layer 139 is formed on a surface of the substrate 121 opposite the buffer layer 123. The reflecting layer 139 may be formed of a metallic material by a sputtering method or an evaporation method.

Figure 4:
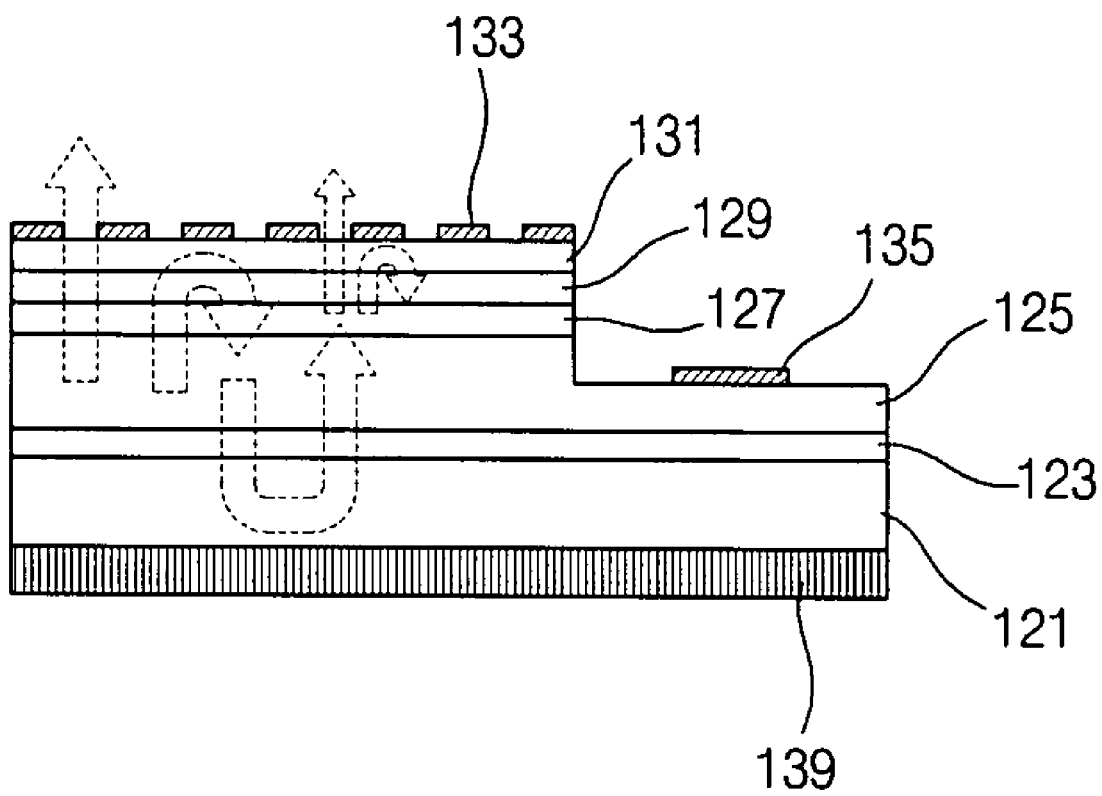
FIG. 4 is a cross-sectional view of an LED chip according to an exemplary embodiment of the present invention.

FIG. 4 is a cross-sectional view of an LED chip according to an exemplary embodiment of the present invention. FIG. 4 shows the travel paths of light in the LED chip.

When a forward bias is applied between the first electrode 135 and the second electrode 133, electrons and holes are transmitted into the light-emitting layer 127 through the first semiconductor layer 125 and the second semiconductor layer 129, respectively. The electrons and the holes are recombined in the light-emitting layer 127, and then light is emitted. The light emitted from the light-emitting layer 127 is polarized in various directions including polarized light whose polarization direction is parallel to or perpendicular to the wires of the grid-shaped second electrode 133.

A first polarized light whose polarization direction is parallel with the wires of the grid-shaped second electrode 133 induces the movement of electrons along a length direction of the wires. Because these electrons are free to move, the grid-shaped second electrode 133 behaves in a similar manner as a surface of a metal layer that reflects light. As a result, some of the first polarized light is absorbed into the grid-shaped second electrode 133, and the rest of the first polarized light is reflected back toward the source.

For a second polarized light whose polarization direction is perpendicular to the wires of the grid-shaped second electrode 133, electrons cannot move very far across the width of each wire. As a result, little energy is lost or reflected, and the second polarized light travels through the grid-shaped second electrode 133.

The first polarized light reflected by the grid-shaped second electrode 133 is reflected again at the reflecting layer 139 and propagates to the grid-shaped second electrode 133. If a thickness of the substrate 121 is greater than a coherence length of the first polarized light, which is a propagation distance from a coherent source to a point where an electromagnetic wave maintains a specified degree of coherence, the first polarized light loses its polarization properties. Thus, the polarization direction of some of the first polarized light passing through the substrate 121 and reaching the grid-shaped second electrode 133 is perpendicular to the wires of the grid-shaped second electrode 133 and then passes through the grid-shaped second electrode 133. Alternatively, even if the thickness of the substrate 121 is not greater than the coherence length of the first polarized light, the first polarized light may lose its polarization properties by treating a surface of the reflecting layer 139 or forming unevenness on the surface of the reflecting layer 139.

A λ/4 plate may be further formed between the substrate 121 and the reflecting layer 139 to improve the reflectance of the first polarized light at the reflecting layer 139 so that most of the first polarized light passes through the grip-shaped second electrode.

The LED lamp including the LED chip may be used for a backlight unit of a liquid crystal display (LCD) device.

Figure 5:
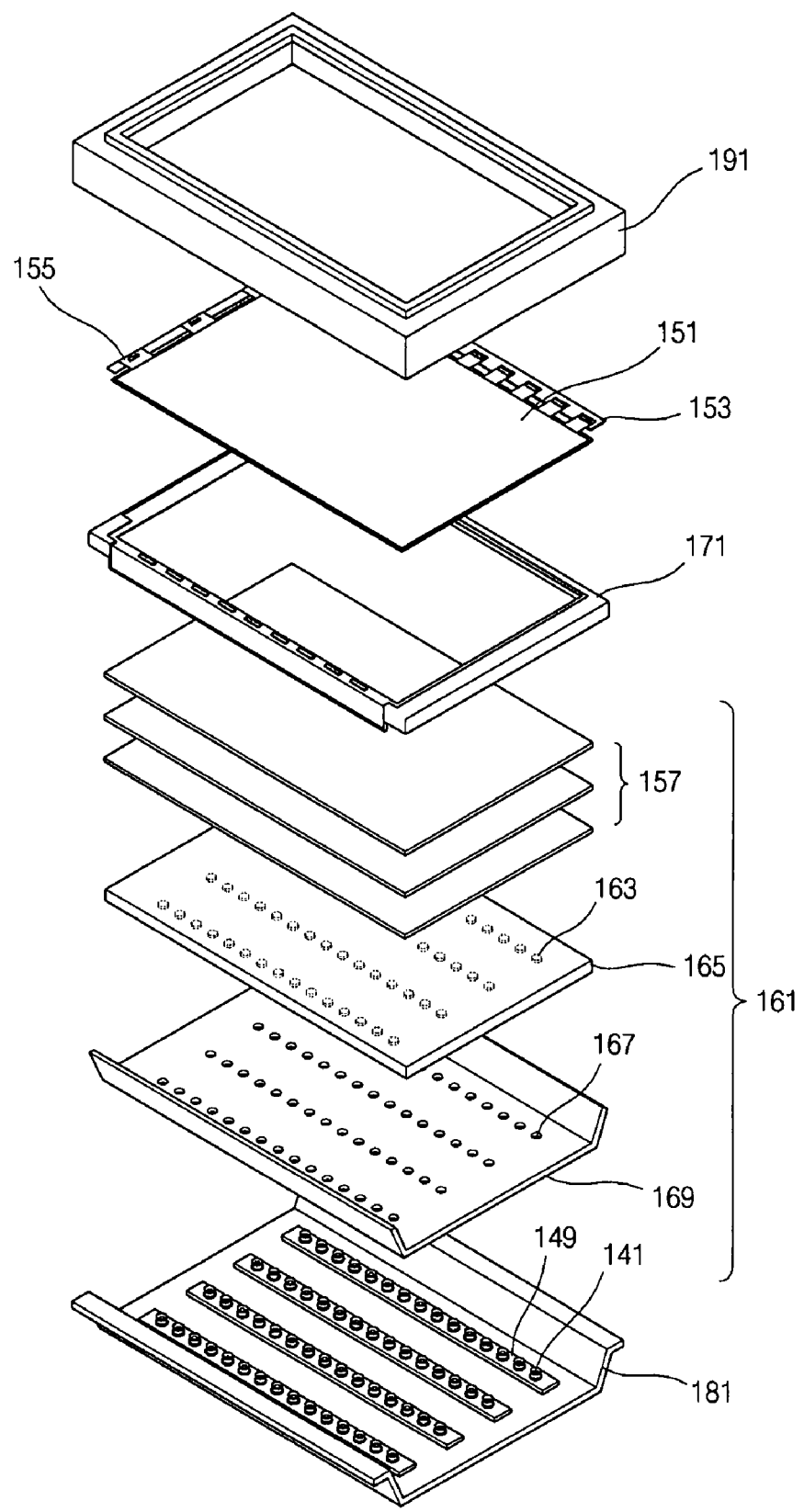
FIG. 5 is a perspective view of an LCD device including an LED backlight unit according to the present invention.

FIG. 5 is a perspective view of an LCD device including an LED backlight unit according to the present invention, and the LED backlight unit provides a liquid crystal panel with a polarized light.

In FIG. 5, a backlight unit 161 is disposed at a rear side of a liquid crystal panel 151, and a main support 171 of a rectangular frame edges the backlight unit 161 and the liquid crystal panel 151. A bottom cover 181 for preventing a loss of light is combined with the main support 171 at the rear side of the liquid crystal panel 151 to thereby cover the backlight unit 161. A top cover 191 is connected to the main support 171 and the bottom cover 181 and covers edges of the front side of the liquid crystal panel 151.

The liquid crystal panel 151 displays images. The liquid crystal panel 151 includes first and second substrates (not shown) attached to each other with a liquid crystal layer interposed therebetween. The liquid crystal panel 151 includes gate lines, data lines, thin film transistors, and liquid crystal capacitors on one of the first and second substrates. Data- and gate-driving integrated circuits 153 and 155 are attached to adjacent sides of the liquid crystal panel 151. The gate-driving circuits 155 provide scanning signals for turning on/off the thin film transistors through the gate lines. The data-driving integrated circuits 153 provide image signals to the liquid crystal capacitors for each frame through the data lines. Although not shown in the figure, the liquid crystal panel 151 further includes first and second polarizers at its outer sides. More particularly, the first polarizer may be disposed between the first substrate of the liquid crystal panel 151 and the backlight unit 161. The second polarizer may be disposed at an outer surface of the second substrate of the liquid crystal panel 151. The first and second polarizers have optical axes perpendicular to each other. Linearly polarized light parallel to the optical axes is transmitted through the first and second polarizers.

The backlight unit 161 provides light to the liquid crystal panel 161. The backlight unit 161 includes a plurality of metal core printed circuit boards (MCPCBs) 149, a plurality of LED lamps 141, a reflecting sheet 169, a transparent plate 165, and a plurality of optical sheets 157.

Each MCPCB 149 has a stripe shape. The MCPCBs 149 are arranged on an inner surface of the bottom cover 181 and are spaced apart from each other. The plurality of LED lamps 141 are laid out on each MCPCB 149 along its length direction. The LED lamps 141 may be one of red, green and blue LED lamps, and the red, green and blue LED lamps 141 may be sequentially arranged on each MCPCB 149, whereby red, green and blue lights are mixed to produce white light. Alternatively, the LED lamps 141 may be white LED lamps.

The reflecting sheet 169 is disposed on the bottom cover 181. The reflecting sheet 169 covers the plurality of MCPCBs 149 and has a plurality of through-holes 167 that correspond to the plurality of LED lamps 141. Thus, the plurality of LED lamps 141 protrude through the plurality of through-holes. The optical sheets 157 are disposed over the LED lamps 141 and the reflecting sheet 169. The optical sheets 157 may include prism sheets and diffusion sheets. A transparent plate 165 may be disposed between the plurality of LED lamps 141 and the optical sheets 157. The transparent plate 165 includes reflecting dots 163 corresponding to the plurality of LED lamps 141.

Each LED lamp 141 includes an LED chip illustrated in FIG. 3 and thus emits light polarized in a predetermined direction. As discussed above, the polarization direction of the light emitted from the LED lamp 141 is perpendicular to the wires of the grid-shaped second electrode 133 of FIG. 3. The optical axis of the first polarizer, beneficially, is arranged in perpendicular to the wires of the grid-shaped second electrode 133. With this configuration, most light emitted from the LED lamp 141 passes through the first polarizer of the liquid crystal panel 151. Therefore, there is little loss of light, and the efficiency of light increases about two times as compared with the related art.

In the present invention, because the LED chip emits a polarized light, there is little loss of light in the LCD device including the backlight unit with the LED chip. Moreover, the power consumption is lowered, and the brightness of the device increases.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display (LCD) device, comprising:
a backlight unit including light-emitting diode lamps and optical sheets on the light-emitting diode lamps, wherein each of the light-emitting diode lamps has a light emitting diode including:
   a substrate;
   a buffer layer on a first surface of the substrate;
   a first semiconductor layer on the buffer layer;
   a light-emitting layer on the first semiconductor layer;
   a second semiconductor layer on the light-emitting layer, wherein the first semiconductor layer is partially exposed through the second semiconductor layer and the light-emitting layer;
   a first electrode on the exposed first semiconductor layer;
   a single second electrode on the second semiconductor layer, the second electrode including a plurality of parallel wires and a wire at an edge of the second semiconductor layer perpendicular to and connecting the plurality of parallel wires such that a first linearly polarized light from the light-emitting layer is reflected by the second electrode and a second linearly polarized light from the light-emitting layer is emitted through the second electrode, wherein the second linearly polarized light is perpendicular to the first linearly polarized light;
   a transparent electrode formed of nickel and gold and disposed between the second semiconductor layer and the second electrode; and
   a reflecting layer on a second surface of the substrate, where a thickness of the substrate is greater than a coherence length of the first linearly polarized light such that some of the first linearly polarized light reflected by the second electrode and passing through the substrate passes through the second electrode;
a liquid crystal panel over the backlight unit, the liquid crystal panel including first and second substrates and a liquid crystal layer between the first and second substrates; and
a polarizer between the backlight unit and the first substrate, wherein the polarizer has an optical axis perpendicular to the wires of the second electrode.

2. The LCD device according to claim 1, wherein each of the light-emitting diode lamps further includes a reflecting frame having an opening in which the light-emitting diode chip is disposed, a phosphorescent material covering the light-emitting diode chip, and a lens over the phosphorescent material.

3. The LCD device according to claim 1, wherein the light emitting diode further includes a $\lambda/4$ plate between the reflecting layer and the substrate.

* * * * *